US009606153B2

(12) United States Patent
Borean et al.

(10) Patent No.: US 9,606,153 B2
(45) Date of Patent: Mar. 28, 2017

(54) SYSTEM AND METHOD FOR THE AUTOMATIC IDENTIFICATION OF ELECTRIC DEVICES/APPLIANCES

(75) Inventors: Claudio Borean, Turin (IT); Leonardo Claps, Bologna (IT); Gabriele Elia, Turin (IT)

(73) Assignee: Telecom Italia S.p.A., Milan (IT)

( * ) Notice: Subject to any disclaimer, the term of this patent is extended or adjusted under 35 U.S.C. 154(b) by 776 days.

(21) Appl. No.: 13/814,189

(22) PCT Filed: Aug. 4, 2010

(86) PCT No.: PCT/EP2010/061341
§ 371 (c)(1),
(2), (4) Date: Feb. 4, 2013

(87) PCT Pub. No.: WO2012/016589
PCT Pub. Date: Feb. 9, 2012

(65) Prior Publication Data
US 2013/0132008 A1    May 23, 2013

(51) Int. Cl.
*G01R 21/00* (2006.01)
*G06N 5/00* (2006.01)
(Continued)

(52) U.S. Cl.
CPC ............ *G01R 21/00* (2013.01); *G01D 4/00* (2013.01); *G06F 17/00* (2013.01); *Y04S 20/38* (2013.01)

(58) Field of Classification Search
CPC ..... G01R 21/00; G01R 21/001–21/003; G01R 21/005–21/006; G06F 17/00; G06N 5/00
See application file for complete search history.

(56) References Cited

U.S. PATENT DOCUMENTS 4,858,141 A     8/1989  Hart et al.
2009/0307178 A1*  12/2009  Kuhns et al. ................... 706/54
2010/0110077 A1   5/2010  Grossman et al.

FOREIGN PATENT DOCUMENTS

GB      2451001 A      1/2009
WO      97/25625 A1    7/1997
(Continued)

OTHER PUBLICATIONS

Ruzzelli et al., Real-Time Recognition and Profiling of Appliances through a Single Electricity Sensor, Jun. 21-25, 2010, 7th Annual IEEE Communications Society Conference on Sensor Mesh and Ad Hoc Communications and Networks (SECON), pp. 1-9.*
(Continued)

*Primary Examiner* — Toan Le
(74) *Attorney, Agent, or Firm* — Banner & Witcoff, Ltd.

(57) ABSTRACT

A system for automatic identification of a device or appliance includes: at least one sensor associatable with the device or appliance to be identified, and able to monitor an evolution in time of an electrical quantity indicative of device or appliance energy consumption; an analyzer communicating with the at least one sensor including receiving reports of the monitored electrical quantity, and automatically identifying the device or appliance by analyzing the evolution in time of the monitored electric quantity. The analyzing calculates a cross-correlation between the evolution in time of the monitored electric quantity and at least one reference pattern representative of at least one sample device or appliance; and when more than one sample device or appliance is included in a candidate list, identifies the device or appliance by performing a selection among the candidates based on characteristic parameters related to the respective calculated cross-correlations.

17 Claims, 7 Drawing Sheets

(51) Int. Cl.
*G01D 4/00* (2006.01)
*G06F 17/00* (2006.01)

(56) References Cited

FOREIGN PATENT DOCUMENTS

WO 2009/097400 A1 8/2009
WO 2009/103998 A2 8/2009

OTHER PUBLICATIONS

Abstract of Ruzzelli et al. reference, Jun. 21-25, 2010, 2 pp.*
ISR and Written Opinion mailed Nov. 2, 2011, PCT/EP2010/061341.
Leslie K. Nortord et al., "Non-intrusive electrical load monitoring in commercial buildings based on steady-state and transient load-detection algorithms," Energy and Buildings, Lausanne, CH, vol. 24, Jan. 1, 1996, pp. 51-64, XP002543035, ISSN: 0378-7788, DOI: 10.1016/0378-7788(95)00958-2, the whole document.

* cited by examiner

SYSTEM AND METHOD FOR THE AUTOMATIC IDENTIFICATION OF ELECTRIC DEVICES/APPLIANCES

CROSS REFERENCE TO RELATED APPLICATIONS

This is a U.S. National Phase Application under 35 U.S.C. §371 of International Application No. PCT/EP2010/0613541, filed Aug. 4, 2010, which was published under PCT Article 21(2), the entire contents of which are incorporated herein by reference.

BACKGROUND OF THE INVENTION

Field of the Invention

The present invention generally relates to the field of home automation/domotics. More specifically, the present invention concerns a method and a related system allowing the automatic recognition of electric devices/apparatuses like household appliances, and, in particular, a method and a system conceived to enable automatic detection of devices/appliances, for example electric devices/appliances connected to the power supply, through the use of a home area network, for example and not limitatively a Wireless Sensor Network (WSN).

Overview of the Related Art

Home automation is an evolving field. In this context, several solutions have been and are being deployed for energy management purposes, and standards are emerging for covering the application scenarios. Some of the known solutions exploit WSNs. As known, a WSN is a network of spatially-distributed autonomous nodes with sensors to cooperatively monitor physical or environmental conditions, such as temperature, sound, vibration, pressure, motion, pollutants. WSNs are nowadays used in many industrial and civilian application areas, including industrial process monitoring and control, machine health monitoring, environment and habitat monitoring, healthcare applications, home automation, traffic control. In addition to one or more sensors, each node in a WSN is equipped with a radio transceiver or other wireless communications device, a small microcontroller, and possibly an energy source, usually a battery. A WSN normally constitutes a wireless ad-hoc network, meaning that each sensor supports multi-hop routing (several nodes may forward data packets to a base station).

GB 2451001 describes a smart metering system using low power radio transmission; the system is composed of several sensors which generate consumption signals and a central unit for display information and graphical data about metering.

WO 2009/097400 discloses systems and methods for monitoring and controlling the power consumption of a power-consuming device. During the installation phase the information about position of smart plugs is set: this information is then used to process the power signal accordingly.

SUMMARY OF THE INVENTION

The Applicant has observed that most of the known solutions require a start-up procedure that involves direct human intervention in order to specify what system the specific sensor node is going to monitor and control. This is believed to be a significant drawback, especially in view of the fact that the average domestic user may be, and often actually is, not accustomed to technical tasks and may thus be discouraged.

The Applicant tackled the technical problem of devising a solution that allows monitoring and possibly controlling devices/appliances, particularly although not limitatively electric devices/appliances, using a home area network, like for example a WSN, without the need of direct or indirect human interaction, at least not in the system set-up phase.

The Applicant has found a solution that enables an automatic procedure for the discovery of the devices/appliances, particularly electric devices/appliances, connected to the home area network, particularly the WSN; leveraging on this functionality, the solution according to the present invention avoids direct human intervention for specifying the devices/appliances to be monitored and possibly controlled.

Essentially, according to an aspect of the present invention, there is provided a system for the automatic identification of a device or appliance. The system comprises:

at least one sensor configured to be associatable with the device or appliance to be identified, and to monitor an evolution in time of at least one electrical quantity indicative of a consumption of energy by the device or appliance; and an analyzer in communication relationship with said at least one sensor and configured to receive therefrom reports of the monitored electrical quantity, the analyzer being further configured to automatically identify the device or appliance by analyzing the evolution in time of the monitored electric quantity.

Said analyzing comprises:

calculating a cross-correlation between the evolution in time of the monitored electric quantity and at least one reference pattern representative of at least one sample device or appliance;

inserting the at least one sample device or appliance in a list of candidate devices or appliances in case a value related to the calculated cross-correlation is above a predetermined threshold;

in case more than one sample device or appliance is included in the candidate list, identifying the device or appliance by performing a selection among the candidate devices or appliances based on characteristic parameters related to the respective calculated cross-correlations and different from said value.

In particular, said at least one reference pattern comprises at least two reference patterns each one corresponding to a respective observed evolution in time of the monitored electric quantity in respect of a specific operating mode of a same sample device or appliance.

Said at least one reference pattern may be generated by averaging observed evolutions in time of the monitored electric quantities of devices or appliances, or by observing the evolution in time of the monitored electric quantity of the device or appliance to be identified during a first cycle of operation thereof, or by detecting characteristic events in the observed evolution in time of the monitored electric quantity.

In particular, said detecting characteristic events comprise detecting peaks in the evolution in time of the monitored electric quantity.

In an embodiment of the present invention, said calculating the cross-correlation may comprises determining an observation temporal window and cross-correlating the monitored electric quantity and the at least one reference pattern in at least one time interval corresponding to the determined observation temporal window.

Preferably, said calculating the cross-correlation is repeated in at least two different time intervals of length equal to the determined temporal window.

Said observation temporal window may for example be determined by detecting characteristic events in the observed evolution in time of the monitored electric quantity.

In an embodiment of the present invention, said analyzing comprises, before calculating the cross-correlation, transforming the observed evolution in time of the monitored electric quantity and the at least one reference pattern into the frequency domain, and wherein said calculating the cross-correlating is performed on the results of the transformation.

In particular, said characteristic parameters may include at least one among a mean value, relative maximum values, standard deviation.

The system may advantageously be embedded into a smart socket through which the electric device or appliance is pluggable to an electricity socket.

According to another aspect of the present invention, a method is provided for the automatic identification of a device or appliance, the method comprising:

associating at least one sensor with the device or appliance to be identified, the sensor being configured to monitor an evolution in time of at least one electrical quantity indicative of a consumption of energy by the device or appliance;

receiving data about the monitored electrical quantity reported by the at least one sensor, and automatically identifying the device or appliance by analyzing the evolution in time of the monitored electric quantity.

Said analyzing comprises:

calculating a cross-correlation between the evolution in time of the monitored electric quantity and at least one reference pattern representative of at least one sample device or appliance;

inserting the at least one sample device or appliance in a list of candidate devices or appliances in case a value related to the calculated cross-correlation is above a predetermined threshold;

in case more than one sample device or appliance is included in the candidate list, identifying the device or appliance by performing a selection among the candidate devices or appliances based on characteristic parameters related to the respective calculated cross-correlations and different from said value.

Some of the advantages of the present invention are:

automated setup and commissioning procedures of the network without human interaction; the system is then "plug and play", and the network startup is made faster;

improved usability of the energy management solution enabled by the home area network;

when smart plugs are used in order to measure the power drained by appliances, the method automatically recognizes an exchange between sockets assigned to different devices;

BRIEF DESCRIPTION OF THE DRAWINGS

These and other features and advantages of the present invention will be more readily understood after reading, in conjunction with the attached drawings, the following detailed description of some exemplary and non-limitative embodiments thereof. In the drawings.

DETAILED DESCRIPTION OF EMBODIMENTS OF THE DRAWINGS

Referring to the drawings, in FIG. 1 there is schematically shown an architecture of a system according to an embodiment of the present invention, particularly a system for energy management and control of devices/appliances, capable of automatically discovering and detecting the devices and/or appliances plugged to an electricity distribution network (i.e., in the described embodiment, electric devices/appliances), based on a processing that, as will be described in detail later, exploits measurements of the absorbed power performed on the devices/appliances themselves by means of sensors of a home area network, for example a WSN.

Figure 1:
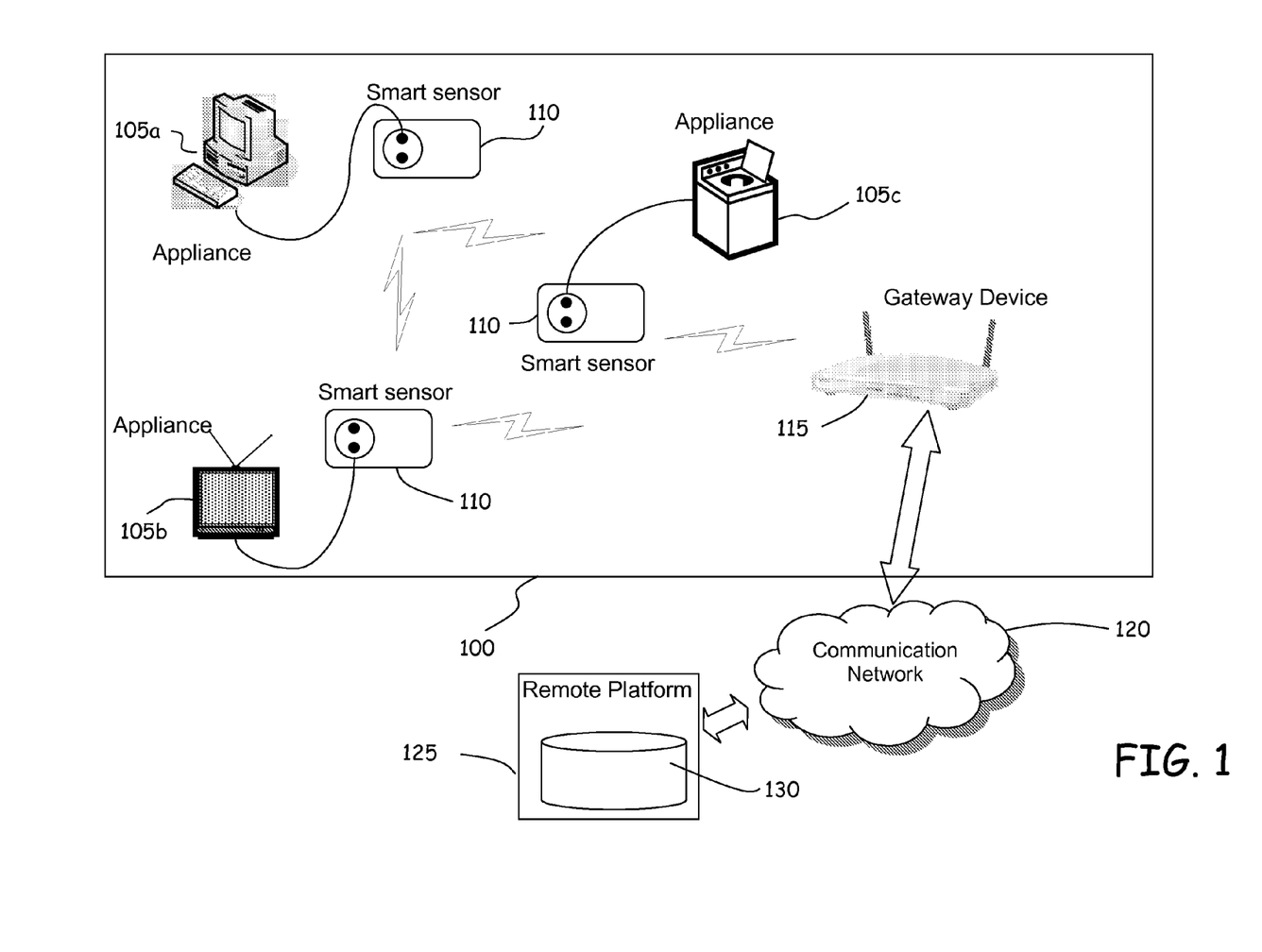
FIG. 1 schematically shows a system according to an embodiment of the present invention.

In FIG. 1, reference numeral 100 denotes a house, e.g. an apartment, wherein there are deployed electric devices and/or appliances, by way of example a personal computer 105a, a television set 105b and a washing machine 105c; clearly, different and/or additional electric devices/appliances may be installed in the apartment 100, like for example a refrigerator, an oven, a dishwasher, a laundry dryer, as well as devices/appliances that not necessarily are powered by electric power (e.g., thermal energy devices/appliances).

The electric devices/appliances 105a, 105b, 105c are plugged to the AC sockets of the house through smart sockets 110, each one incorporating a sensor node of a home area network, preferably a wireless network, e.g. a WSN (hereinafter, and unless the contrary is stated, reference numeral 110 will be used equivalently to denote the smart socket or the sensor node embedded therein); the use of smart sockets 110 including sensor nodes is advantageous because there is no need to have dedicated devices/appliances already embedding sensor nodes, so that the present invention can be practiced also in conjunction with already deployed devices/appliances; however nothing prevents from exploiting the present invention also in case devices/appliances with embedded sensor nodes are used. The sensors in the sensor nodes 110 are configured to perform electric power and energy measurements on the devices/appliances that are connected to the respective smart sockets; the sensors may comprise an integrated circuit operating the measurements, and a relay to manage the electric power to be distributed to the loads connected to the physical AC socket.

In embodiments of the present invention, the home area network is for example, as mentioned above, a WSN. Each sensor node 110 includes a wireless transceiver, adapted to wirelessly communicate with other nodes of the WSN based on a wireless communication protocol, for example, and not limitatively, a ZigBee protocol, or other suitable mesh networking protocols. Some or possibly each one of the nodes 110 of the WSN are configured to act as relay nodes, i.e. as wireless routers between the other WSN nodes 110 and a gateway 115 (moreover, nothing prevents that the gateway function be embedded in one of the WSN nodes 110).

The gateway 115 is configured to manage the electric devices/appliances 105a, 105b, 105c and to gather, from the respective WSN nodes 110, the information related to the different devices/appliances.

The gateway 115 is also configured to communicate, through a communication network 120 like a telephone network (either mobile or not, or a combination of the two) and/or a packet data network like the Internet, with a remote platform 125, comprising one or more, possibly distributed, servers; the remote platform 125 is configured to gather the data sent by the WSN nodes 110 to the gateway 115 and to store them in suitable databases 130, in order to make the stored data accessible by remote applications (the access to the data managed by the remote platform 125 by the remote applications may for example be performed using high-level APIs—Application Programming Interfaces).

A method according to an embodiment of the present invention for the automatic recognition (i.e. identification) of the type of electric devices/appliances plugged to the electricity distribution network will be now described.

Figure 2:
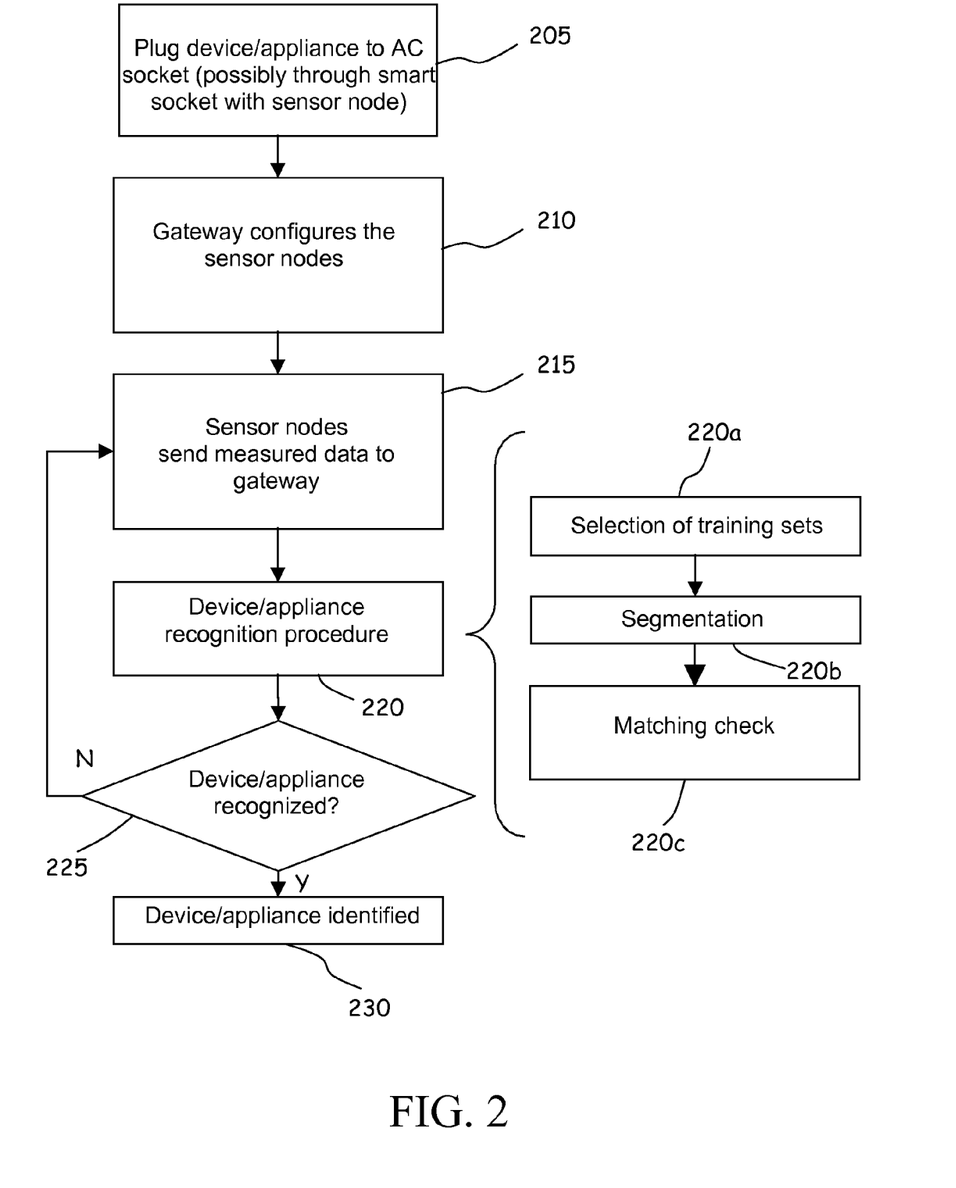
FIG. 2 is a schematic flowchart of the main steps of a method according to an embodiment of the present invention.

FIG. 2 is a schematic flowchart of the main phases of the method.

The electric devices/appliances are plugged by the user to the sockets of the AC distribution network through the smart sockets 110, which incorporate the sensor nodes (block 205). In case the device/appliance already embeds a sensor node, the smart socket is not required and the device/appliance can be plugged to the AC main socket directly.

In a configuration phase, the sensors in the sensor nodes 110 are automatically configured by the gateway 115 (block 210), for example using a wireless communication protocol, like the ZigBee protocol; the configuration is aimed at enabling the sensors nodes 110, and the sensors embedded therein, to perform, on the associated electric devices/appliances, measurements of instantaneous electric power consumption and energy absorbed. For example, the sensor nodes 110 are configured in such a way as to cause the sensor nodes 110 to report to the gateway 115 information related to the measured device/appliance power consumption and absorbed energy (block 215). The reporting procedure by the sensor nodes 110 to the gateway 115 may for example follow the following guidelines:

periodically report measurement data to the gateway 115 after a maximum amount of time ($T_{MAX}$) elapsed between a previous measurement data report;

extemporarily report to the gateway 115 when the measured value of instantaneous power and cumulative energy is above certain thresholds; such thresholds may be pre-stored in the sensor nodes 110 or they may be configured by the gateway 115 (either locally on the gateway or remotely by a host application using the gateway 115 itself) in the configuration phase: in this case the generic sensor node 110 reports to the gateway 115 a change in the value of the monitored quantity.

According to an embodiment of the present invention, in order to avoid the need of a manual configuration of the association between the sensor nodes 110 and the respective devices/appliances, a procedure is performed for automatically recognizing the electric device/appliance plugged to the AC socket through the smart socket 110 containing the sensor node(s) (block 220). In an embodiment of the present invention, the automatic device/appliance recognition procedure may preferably comprise the following three phases (which are described in detail in the following):

selection of training set(s) phase (block 220a);
segmentation phase (block 220b);
matching check phase (block 220c).

The device/appliance recognition procedure is repeated until the device/appliance is identified (blocks 225 and 230).

Figure 3:
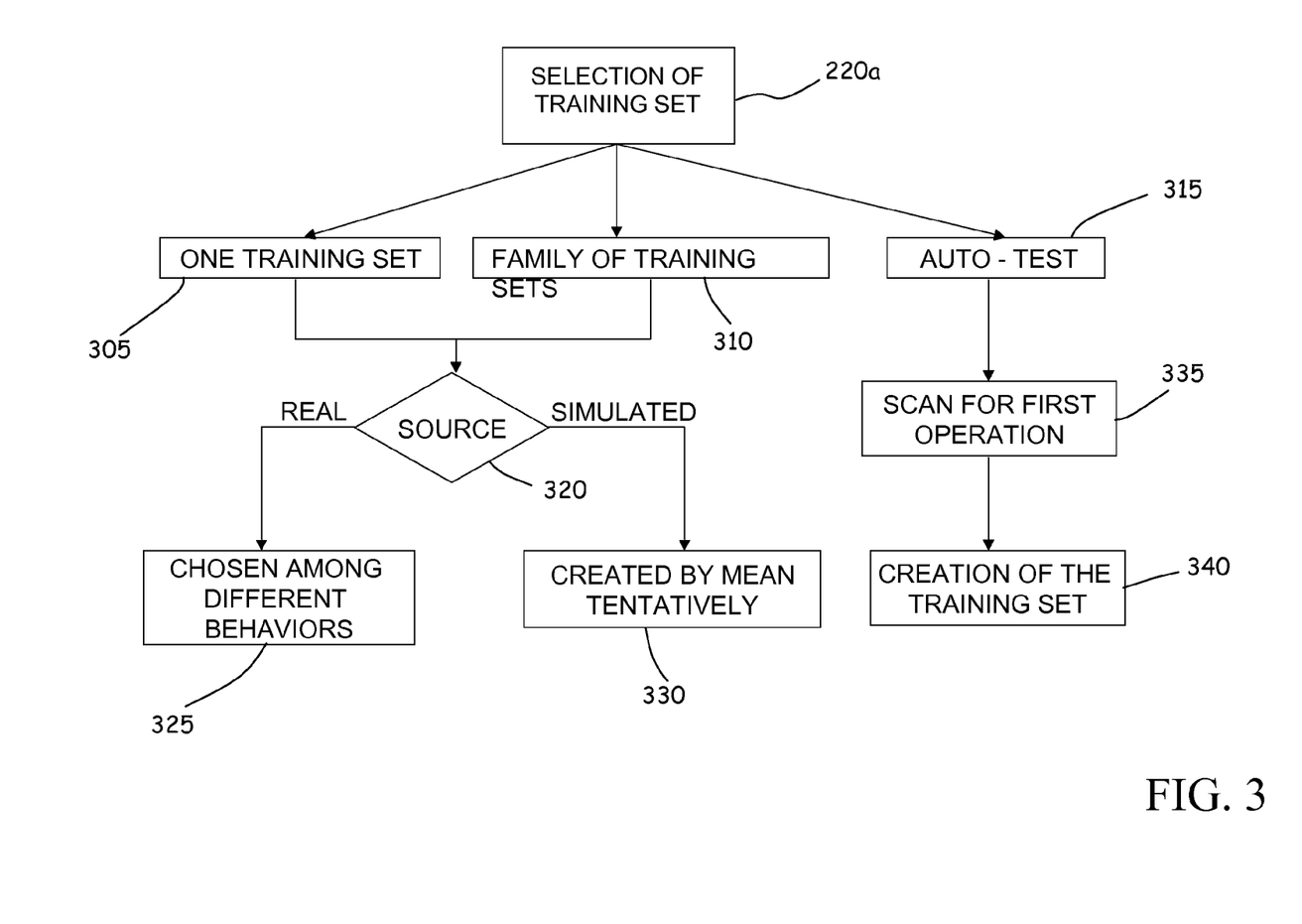
FIG. 3 is a schematic flowchart of a first procedure part of a device/appliance recognition process of the method of FIG. 2, according to an embodiment of the present invention.

The phase 220a for the selection of the training sets may, according to an embodiment of the present invention, be carried out as schematized in the flowchart of FIG. 3. A training set may be defined as a reference pattern for the evolution in time of the power consumption, corresponding to a known electric device/appliance or class of electric devices/appliances. For example, the instantaneous power over time may be chosen as the quantity to be monitored and to be used for the identification of the devices/appliances.

According to the above-described reporting procedure, the generic sensor node 110 is configured to report the measured data to the gateway 115 in case of changes in the measured values above predetermined thresholds, or in any case, even when no changes greater than the predetermined thresholds occur, after the maximum amount of time $T_{MAX}$ from a previous measurement data report is elapsed. In particular, the generic sensor node 110 measures the instantaneous power consumption of the associated device/appliance. Thanks to this, the reported instantaneous power measurements can advantageously be used by the gateway 115 (or by the remote platform 125) to track the real power consumption curve of the electric device/appliance concerned.

It is observed that the reporting procedure of the measurements data from the sensor nodes to the gateway involves a reduction in the number of measurement samples available at the sensor nodes (the number of measurement samples taken by the sensor, e.g. a power meter, is significantly higher than the number of samples transmitted to the gateway 115 by the sensor node 110). This reduction in the number of measurement samples can be described as a noise perturbing the measure of the monitored quantity, e.g. the instantaneous power. Such a noise can nevertheless be filtered out by means of the matching check process described later on.

A sliding temporal window of suitable time length is used to process the incoming data about real power consumption measurements provided by the generic sensor node 110 to the gateway 115. The data contained in the current temporal window (a "snapshot" of the data flow received at the gateway 115) are compared to one or more training sets.

According to an embodiment of the present invention, three options are provided for the selection of the training set(s):

a) one (i.e., single) training set (block 305): the data contained within the current temporal window are compared to a single training set; this way can be useful for those kinds of electric devices/appliances that, in operation, exhibits substantially always the same behavior;

b) family of training sets (block 310): in this case, the data contained in the current temporal window are compared to two or more, possibly several different training sets of a training stets family, which can for example describe different behaviors of the electric device/appliance (e.g. a washing machine which may be programmed to operate according to different washing programs);

c) "auto-test" (block 315): in this case, the measured data collected in respect of the first cycle(s) of operation of the electric device/appliance (i.e. the instantaneous power measured data corresponding to, and collected in respect of the first cycle(s) of operation of the electric device/appliance) are taken as the training set, i.e. as the reference pattern to be used thereafter for the comparisons with the data contained in the sliding temporal window.

In cases a) and b), the nature of the source of the training set is then chosen (block 320). Possible training set sources are:

real source: the training set to be used for the device/appliance recognition is selected among training sets corresponding to different possible behaviors of known electric devices/appliances (block 325). For example, the training set can be chosen among a pool of reference patterns corresponding to different functions of the known devices/appliances, each one describing a specific behavior of the known devices/appliances (for example, a low-temperature washing cycle of a laundry washer, an economy washing cycle of a dishwasher); these functions are obtained by observation and selection of the change over time of the instantaneous power consumed by the device/appliance while operating according to a specific function;

simulated source: in this case, the training sets are created by averaging the main features of the actual behaviors (block 330). After several trials of matching using real training sets, the most successful ones are processed for creating a new training set, being an average of them.

In case c), the collected data are scanned, looking for the first peak in the curve of the instantaneous power consumption (block 335). The scan of the data is for example done using the same technique as the one described in the following for the "recognition of events" process in the segmentation phase 220b. Then, the power consumption curve following the first peak of power is "recorded" until the measured instantaneous power returns to zero for a certain time. The recorded data becomes the training set to be used afterwards (block 340).

Figure 4:
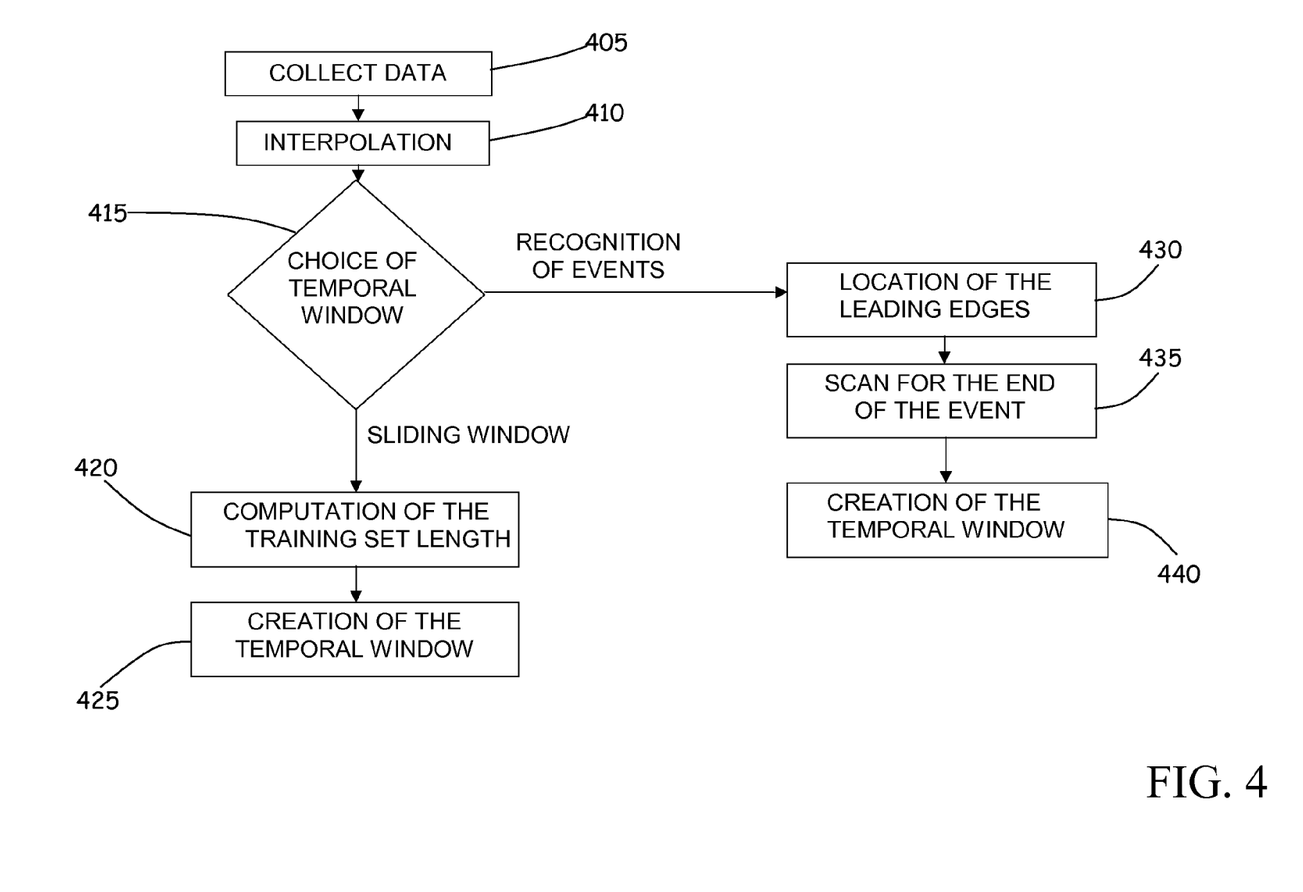
FIG. 4 is a schematic flowchart of a second procedure part of the recognition process, according to an embodiment of the present invention.

The segmentation phase 220b may, according to an embodiment of the present invention, be carried out as schematized in the flowchart of FIG. 4.

The segmentation process carried out in the segmentation phase 220b is directed to identify the cycle of operation of the electric device/appliance connected to the sensor node 110, enabling comparison between discrete sets of data that need to be classified properly. In particular, the segmentation process aims at creating the temporal window that will thereafter be exploited in matching phase.

Firstly, the data received from the sensor nodes 110 are gathered in a database (block 405); the data may be collected locally on the gateway 115 or remotely in the remote platform 125; the processing of the gathered data may be carried out by the gateway 115 or by the remote platform 125. Before the data are processed, data relating to an observation time period are gathered; the observation time period may be configurable, and may for example be set to correspond to one day, one week or a longer period.

Due to the different times of arrival of each measurement data sample, the collected data should be managed and put in a same time base. This may be done by linearly interpolating (e.g., by performing a Spline interpolation using a polynomial of degree higher than 1) the data and time of arrival, the latter being for example described by a time-stamp assigned to the received data (block 410); in an embodiment of the invention, the interval between two successive data samples may be about 10 seconds, so as to avoid excessive growth of the dataset.

The temporal window to be used in the subsequent matching phase is then chosen (block 415). The temporal window may be defined in two ways:

a) using a sliding window, that creates a matching window for each sample interpolated;

b) using a "recognition of events" method, that allows recognizing the presence of an event and isolating a proper temporal window in respect of it.

The main difference between these two methods resides in the computational time, because the sliding window method calls for verifying the matching continuously.

Let case a) be considered. The length (width) of the training set is calculated (block 420). The width of the temporal window is defined by the length of the training set. Since the choice can be made among several possible training sets, each one with its own length, the temporal windows created by the segmentation process may be different from case to case. The temporal window is then created: the temporal window is created for each sample, and has a width defined by the length of the training set (block 425).

In case b), leading edges of the power consumption curve relating to the device/appliance to be recognized are located (block 430). To this purpose, two thresholds may be defined:

a power threshold: if the instantaneous power absorbed by the device/appliance exceeds this value, the start of a leading edge is declared;

time threshold: if the power consumption of the device/appliance remains above the power threshold for a time longer than the time threshold, a leading edge is recognized;

A scan is then performed over the whole observation time period, looking for the leading edges using the above defined thresholds. At the end of the process, a list of start points of all the leading edges is created. After each detected leading edge, the end of the event is determined (block 435). To this purpose, a search is performed to find the first sample that satisfies the two following threshold:

power threshold: if the power of the device falls below this value, the end of the event is declared;

time threshold: if the power of the device remains below the power threshold for a time greater than the time threshold, the end of the event is recognized.

The temporal window is then created (block 440), based on the positions of the detected leading edges and the respective ends of the events.

According to an embodiment of the present invention, the matching check phase 220c is based on the Bayesian decision theory. The formula for decision is:

$$\frac{P(r|H1)}{P(r|H0)} \begin{array}{c}>\\<\end{array} \varepsilon$$

where P(r|H1) is the a posteriori probability of hypothesis H1, P(r|H0) is the a posteriori probability of hypothesis H0. The ratio on the left of the inequality is called "plausibility function" and can be regarded as the distance between the two hypotheses, H1 and H0. If the plausibility function is bigger than the decision threshold $\varepsilon$, the hypothesis H1 is chosen, otherwise hypothesis H0 is chosen.

The method described below aims at identifying the device/appliance that minimizes the distance between its own instantaneous power consumption curve x(t) and the curve y(t) defined by the selected training set. The formula for the distance used is the Euclidean distance:

$$D = \int_{-\infty}^{+\infty} [x(t) - y(t)]^2 dt = E_x + E_y - 2\int_{-\infty}^{+\infty} x(t)y(t)dt$$

The integral in the above formula is developed in its components by applying the linearity property of integral transformation (f(x+y)=f(x)+f(y) and f(ax)=af(x)); $E_x$ and $E_y$ are the energy of each function (instantaneous power consumption curve of the device/appliance to be recognized and of the training set, respectively) while the last addend in the formula on the right can be seen as the cross-correlation in a temporal window where the two functions overlap. The cross-correlation is a function that is useful to provide a measure the affinity of two different signals and the delay needed for them to overlap. The formula, in a time-discrete scenario as the one here considered, is:

$$R_{xy}[n] = (x \otimes y)[n] \stackrel{def}{=} \sum_{m=-\infty}^{\infty} x^*[m]y[n+m]$$

The value of the cross-correlation is compared to a threshold, that preferably can be configured. The correlation can be normalized to the energy by dividing $R_{xy}$ by a norm factor, obtained for example as follows:

$$E_x = \int_{-\infty}^{+\infty} x^2(t)dt$$
$$E_y = \int_{-\infty}^{+\infty} y^2(t)dt$$
$$Norm = \sqrt{E_x \cdot E_y}$$

Figure 5:
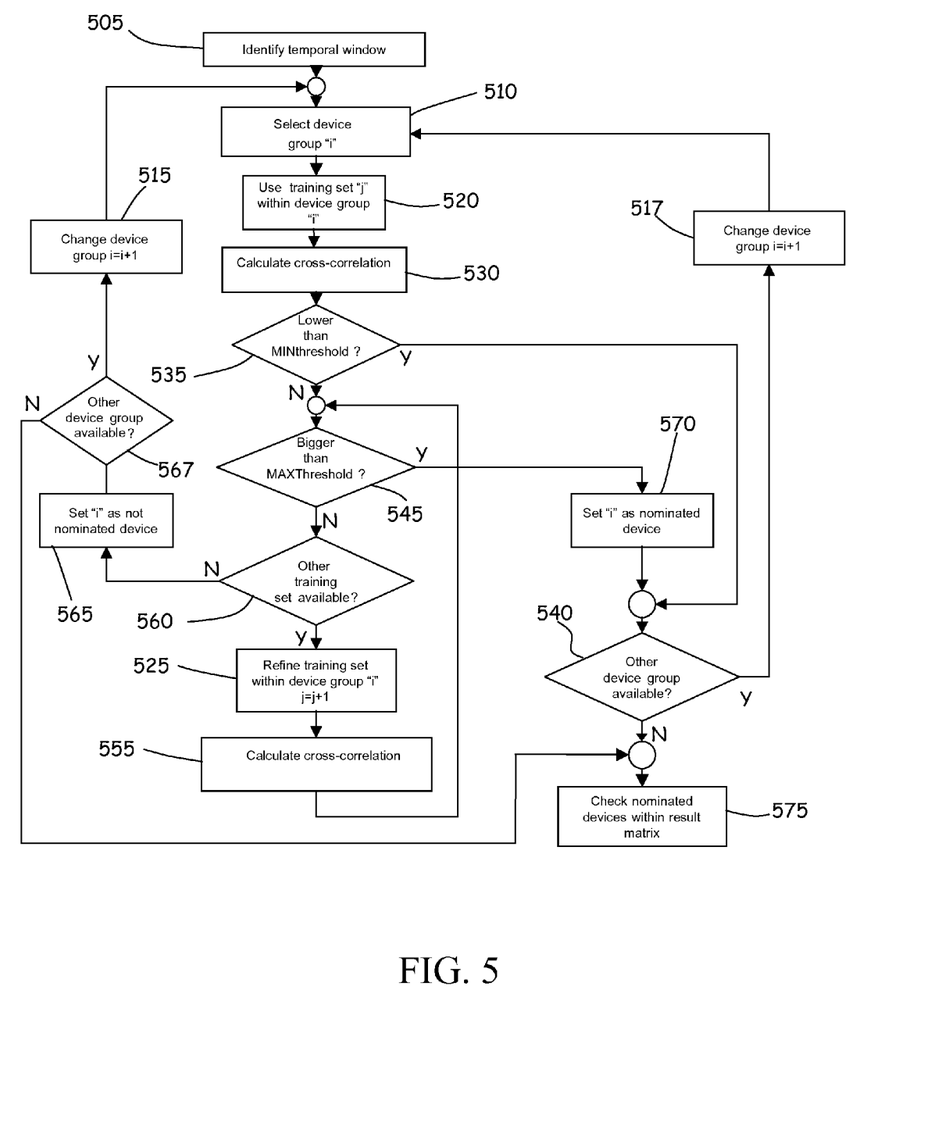
FIG. 5 is a schematic flowchart of a third procedure part of the recognition process, according to an embodiment of the present invention.

FIG. 5 is a schematic flowchart of the matching check phase 220c, according to an embodiment of the present invention.

Once the temporal window is identified (block 505) using the segmentation procedure described above, iterations are performed among all the classes (groups) of devices/appliances (i.e. washing machine, refrigerator, dishwasher, oven, microwave oven, television set, personal computer, etc.) that might be recognized in the stream of data received by the sensor nodes 110. A running index i in the flowchart is used to iterate the procedure for the different classes of devices/appliances; and at each iteration, a new class of devices/appliances is selected (blocks 510, 515 and 517).

For each class of devices/appliances, one or more training sets, for example a family or group of training sets, is/are available and is/are used for the matching check; each training sets group contains a set of signal patterns to be used for trying the match with the data within the current temporal window. When more than one training sets are available, the training sets (at least some of them, possibly all) within the group corresponding to the selected group of devices/appliances are considered in succession (running index j in the flowchart, and blocks 520 and 525).

For evaluating the match between the selected training set j and the data within the current temporal window, the energy-normalized cross-correlation is calculated as described above (block 530).

If the calculated energy-normalized cross-correlation is below a predetermined minimum threshold MINthreshold (block 535, exit branch Y), i.e., if the correlation between the selected training set and the data in the current temporal window is too weak, this means that, with a probability proportional to (1-MINthreshold), the data contained in the current temporal window do not correspond to any device/appliance belonging to the currently selected device group. No further attempts are made with other training sets of the family, and the next group of devices is then selected (block 517) to search a potential match in the data set, provided that there are further device/appliance groups still to be tried (block 540 exit branch Y).

On the other hand, if the calculated energy-normalized cross-correlation is not below the minimum threshold MINthreshold (block 535, exit branch N), it is checked whether the calculated energy-normalized cross-correlation is below or above a predetermined maximum threshold MAXthreshold (block 545). If the calculated energy-normalized cross-correlation is below the maximum threshold MAXthreshold (block 545, exit branch N), a new training set j=j+1 is selected for the device/appliance group i under consideration (block 525), in order to iterate the pattern matching and check if it is possible to improve the match likelihood by verifying the cross-correlation against the new training set (block 555). If however there are no more training sets available for the currently selected group of devices/appliances (block 560, exit branch N), the currently selected device/appliance group i is not put in a list of candidate devices/appliances responsible for the generation of the data (block 565), and the procedure is iterated on a new group of devices/appliances (block 515), after assessing whether other devices/appliances groups exist (decision block 567, exit Y—other devices/appliances groups available—or exit N—no more devices/appliances groups to be tested).

In case the calculated cross-correlation is bigger the maximum threshold MAXthreshold (block 545, exit branch Y), then the currently selected class of devices/appliances is put in the candidate list (block 570).

At the end of all the iterations, if the list of candidates is void, the currently selected temporal window is discarded.

The above described process is repeated for a number of, e.g. consecutive, temporal windows (minimum 1; the number of consecutive temporal windows depends on the number of groups of events that one wishes to take into account).

In this way, a list of candidate (classes of) devices/appliances is built, which contains candidate (classes of) devices/appliances for which the (energy-normalized) cross-correlation between the data measured by the sensors and the reference pattern(s) defined by the training set(s), in at least one of the considered temporal windows, is above the maximum threshold MAXthreshold.

If there are candidates in the list, the device/appliance that generated the collected data stream is one of the devices/appliances in the candidates list.

According to an embodiment of the present invention, a cross-comparison is performed, to reduce the probability of "false positives" included in the list of candidates, and thus improving the reliability of the matching (block 575).

Figure 6:
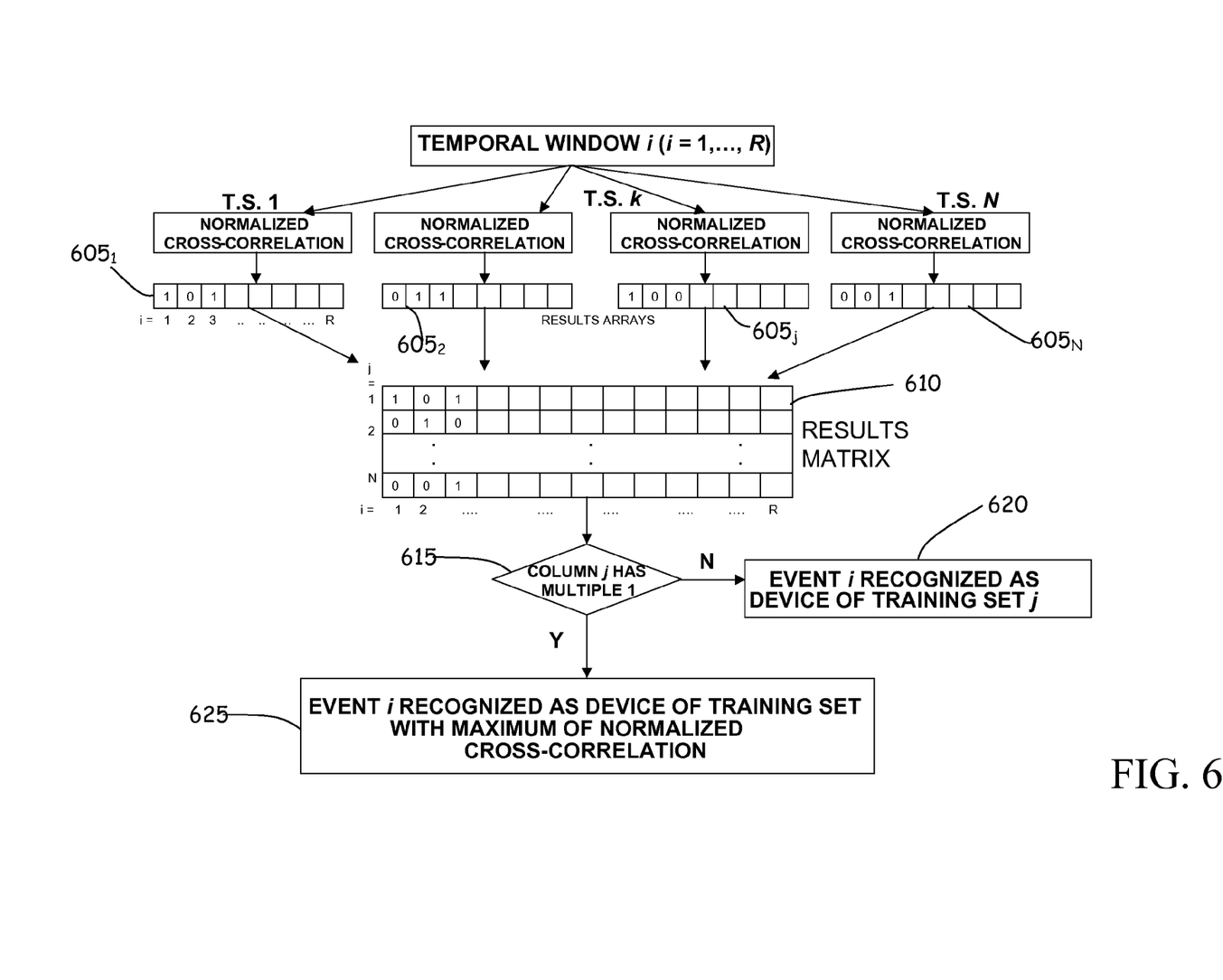
FIG. 6 schematically depicts a procedure for selecting a device/appliance among different possible candidates.

Reference is made to FIG. 6. As mentioned above, the matching process is operated separately on each temporal window (index i, from 1 to R), in respect of different classes of devices/appliances (training set—TS–index j, from 1 to N), each class having associated therewith one or more (possibly a family of) training sets, created for example as described in the foregoing.

Each training set TS (or each family of training sets) corresponds to and identifies a single class of devices/appliances (e.g. washing machine, dishwasher, refrigerator, oven, etc.).

For each class of devices/appliances, an array of R elements $605_1$-$605_N$ is created, each element of the array corresponding to the outcome of the matching process (i.e., calculation of the cross-correlation and comparison with the thresholds MINthreshold and MAXthreshold) in a respective one of the R temporal windows. In the arrays $605_1$-$605_N$, the result of every matching is for example indicated as a "1" in case the event is recognized (i.e., the calculated cross-correlation is above the maximum threshold MAXthreshold), and it is indicated as "0" if the event is not recognized (i.e., the calculated cross-correlation is below the maximum threshold MAXthreshold). In this way, N arrays are created, containing the results of the matching process in every temporal window i of the set of R temporal windows.

Then the N arrays are joined together to create a single matrix of matching results 610, of dimensions R×N. In the matrix 610, the generic row j provides the results of the matching process in the R temporal windows for a certain class of devices/appliances, whereas the generic column i provides the results of the marching process in the generic temporal window in respect of the different classes of devices/appliances.

The combined results matrix 610 can be scanned column by column, looking for those temporal windows in which an event has been recognized and matched by more than one training sets, i.e. by more than one class of devices/appliances. For example, if the scan for column i (i-th temporal window) returns a "0", the event in the temporal window i has not been recognized by using any training set, i.e. none of the devices/appliances classes corresponds to the device/appliance that generated the data stream; if the matrix scan returns a single "1", on row j (block 615, exit branch N), the event is recognized as having been caused by a device/appliance belonging the class of devices/appliances of row j (block 620). If the matrix scan returns more "1"s (block 615, exit branch Y), meaning that more than one class of device/appliance matched the event, a second comparison is performed using the value of the calculated cross-correlation in the temporal window i. Then, the event of temporal window i is recognized as caused by a device/appliance of the class in respect of which the highest cross-correlation was obtained (block 625).

As an alternative to performing the selection based only on the comparison of the calculated value of the cross-correlation, the cross-correlation functions and their characteristic parameters such as mean value, relative maximum values, standard deviation or others may also be taken into consideration and analyzed. In this way, an increased number of parameters can be used to improve the reliability of the outcome of the matching process.

A different technique can also be applied for certain classes of devices/appliances that generate pseudo-periodical data sets (such as refrigerators or boilers): in such cases, exploiting an analysis in the frequency domain instead of in the time domain can simplify the matching process. In this case, besides the segmentation process described above that leverages on the recognition of the events, a broader temporal window containing several pseudo-periods of the signal are considered. Both the data set and the training sets are transformed into the frequency domain (using for example a Fourier transform). The transformed signals have the advantage to highlight the harmonics of pseudo-periodic behaviors leading to a faster recognition then the signals in the time domain; the recognition can be performed using the pattern matching technique with the cross correlation described above.

Possible alternative embodiments of the invention could be the usage of a distributed algorithm to operate the classification of the signal: the processing could be performed in this case locally by the sensor nodes if the processing capabilities of the nodes allow that.

The method according to the herein described embodiment of the present invention can be performed as a software implementation in the network gateway 115 (typically, a device having limited computational resources) or as a remote middleware in case the data gathered from the sensor nodes are logged in a remote database and processed remotely in a more powerful device.

Figure 7:
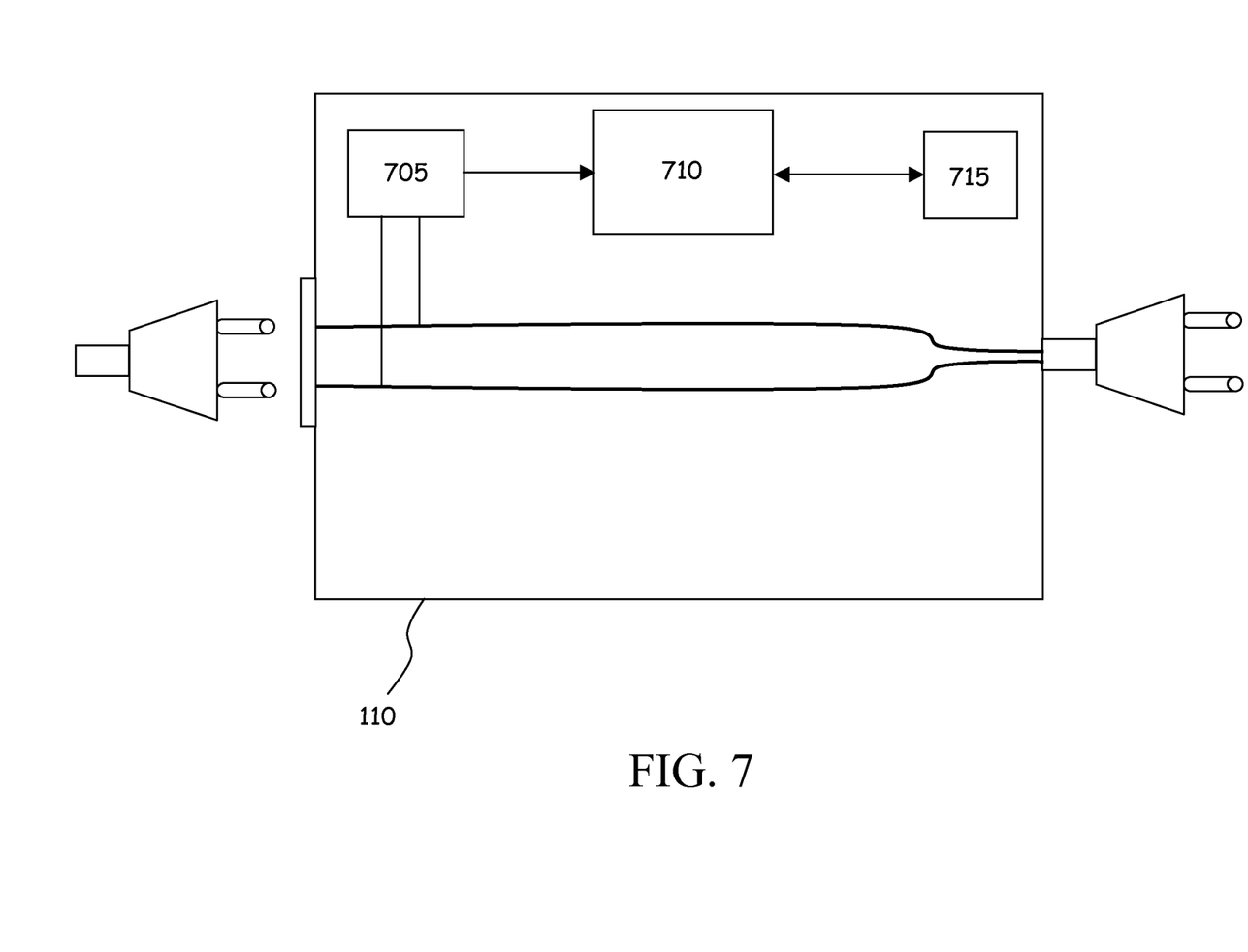
FIG. 7 schematically shows a smart socket according to an embodiment of the present invention.

In alternative or in combination, at least part of the method previously described can be implemented directly in the smart sockets 110. FIG. 7 schematically shows the main components of a smart socket 110: block 705 denotes one or more sensors of electrical quantities, like current, voltage or power, for example a current meter or a voltage meter. The sensor 705 sends the measured data to a microprocessor or microcontroller 710. A transceiver 715 enables e.g. wireless communications with the gateway 115 and with other nodes 110 of the network. The method according to the present invention may be performed by the microprocessor 710 which executes a specific program.

The method described can be also used for automatically detecting events on the monitored devices/appliances, like for example changes in the proper behavior of the appliances based on which imminent faults or degradation of their performances can be predicted.

The present invention is applicable and useful in different technical fields such as residential energy management system, in order to detect the devices connected to the main power using a home area network like a WSN to operate energy management applications (e.g. stand-by control, peak avoidance), and commercial energy management systems, in order to detect event related to the energy monitoring and operate self-recognition of devices monitored by using the WSN.

The present invention has here been disclosed by describing some embodiments thereof. Those skilled in the art will be able to devise several modifications to the described embodiments, without departing from the protection scope defined in the appended claims. For example, other types of home area network can be used instead of WSNs for networking the sensor nodes, like Power Line Carrier (PLC), and more generally ultra-low-power networks (e.g., Bluetooth, WiFi), or also a wired LAN.

Also, although the present invention has been here described making reference to electric devices/appliances, the present invention can be applied as well to non-electric devices/appliances, like for example thermal-energy devices/appliances, for example, a system of independent heat radiators, each one equipped with its own thermostat, and thus each one exhibiting a peculiar behavior in terms of absorbed thermal energy. In this case, a sensor may be provided in operative association with each device/appliance that transduces the monitored quantity, for example thermal energy, into an electrical signal, and the analysis may thus be performed on the transduced electrical signal.

The invention claimed is:

1. A system for automatic identification of a device or appliance, the system comprising:
   at least one sensor configured to be associated with the device or appliance to be identified, and to monitor an evolution in time of at least one electrical quantity indicative of energy consumption by the device or appliance, wherein the device or appliance comprises an electric device or appliance, and wherein the electric device or appliance is connectable to an electric socket via the system; and an analyzer in communication with said at least one sensor and configured to receive therefrom reports of the monitored at least one electrical quantity, and to automatically identify the device or appliance by analyzing the evolution in time of the monitored at least one electrical quantity, wherein said analyzing comprises:

determining an observation temporal window for the evolution in time of the monitored at least one electrical quantity, wherein the determining the observation temporal window comprises:

determining that an instantaneous value associated with the monitored at least one electrical quantity exceeds a threshold value; and determining that a start time of the observation temporal window corresponds to a time that the instantaneous value associated with the monitored at least one electrical quantity exceeds the threshold value;

calculating a cross-correlation between the evolution in time of the monitored at least one electrical quantity and at least one reference pattern representative of at least one sample device or appliance in at least one time interval corresponding to the determined observation temporal window;

inserting the at least one sample device or appliance in a candidate list in case a value related to the calculated cross-correlation is above a predetermined threshold; and in case at least two sample devices or appliances are included in the candidate list, identifying the device or appliance by performing a selection among the at least two sample devices or appliances included in the candidate list based on characteristic parameters related to the respective calculated cross-correlations and different from said value.

2. The system according to claim 1, wherein said at least one reference pattern comprises at least two reference patterns each one corresponding to a respective observed evolution in time of the monitored at least one electrical quantity in respect of a specific operating mode of a same sample device or appliance.

3. The system according to claim 1, wherein said at least one reference pattern is generated by averaging observed evolutions in time of the monitored at least one electrical quantity of the at least one sample device or appliance.

4. The system according to claim 1, wherein said at least one reference pattern is generated by observing the evolution in time of the monitored at least one electrical quantity of the device or appliance to be identified during a first cycle of operation thereof.

5. The system according to claim 4, wherein the at least one reference pattern is generated by detecting characteristic events in the observed evolution in time of the monitored at least one electrical quantity.

6. The system according to claim 5, wherein said detecting characteristic events comprises detecting peaks in the evolution in time of the monitored at least one electrical quantity.

7. The system according to claim 1, wherein said calculating the cross-correlation is repeated in at least two different time intervals of length equal to the determined observation temporal window.

8. The system according to claim 1, wherein said analyzing comprises, before calculating the cross-correlation, transforming the evolution in time of the monitored at least one electrical quantity and the at least one reference pattern into a frequency domain, and wherein said calculating the cross-correlating is performed based on results of the transformation.

9. The system according to claim 1, wherein said characteristic parameters include at least one of a mean value, relative maximum values, and standard deviation.

10. The system according to claim 1, wherein the system is embedded into a smart socket.

11. The system of claim 1, wherein the determining the observation temporal window comprises:

determining that a second instantaneous value associated with the monitored at least one electrical quantity falls below a second threshold value; and determining that an end time of the observation temporal window corresponds to a time that the second instantaneous value associated with the monitored at least one electrical quantity falls below the second threshold value.

12. The system of claim 1, wherein the determining the observation temporal window comprises:

determining that a value associated with the monitored at least one electrical quantity falls below a second threshold value for at least a threshold amount of time; and determining that an end time of the observation temporal window corresponds to a time that the value associated with the monitored at least one electrical quantity falls below the second threshold value for at least the threshold amount of time.

13. A method for automatic identification of a device or appliance, the method comprising:

associating at least one sensor with the device or appliance to be identified, the sensor being configured to monitor an evolution in time of at least one electrical quantity indicative of energy consumption by the device or appliance, wherein the device or appliance comprises an electric device or appliance, and wherein the electric device or appliance is connectable to an electric socket; and receiving data about the monitored at least one electrical quantity reported by the at least one sensor, and automatically identifying the device or appliance by analyzing the evolution in time of the monitored at least one electrical quantity, wherein said analyzing comprises:

determining an observation temporal window for the evolution in time of the monitored at least one electrical quantity, wherein the determining the observation temporal window comprises:

determining that an instantaneous value associated with the monitored at least one electrical quantity exceeds a threshold value; and determining that a start time of the observation temporal window corresponds to a time that the instantaneous value associated with the monitored at least one electrical quantity exceeds the threshold value;

calculating a cross-correlation between the evolution in time of the monitored at least one electrical quantity and at least one reference pattern representative of at least one sample device or appliance in at least one time interval corresponding to the determined observation temporal window;

inserting the at least one sample device or appliance in a candidate list in case a value related to the calculated cross-correlation is above a predetermined threshold; and in case more than one sample device or appliance is included in the candidate list, identifying the device or appliance by performing a selection among the more than one sample device or appliance included in the candidate list based on characteristic parameters related to the respective calculated cross-correlations and different from said value.

14. The method of claim 13, wherein calculating the cross-correlation comprises:

calculating the cross-correlation between the evolution in time of the monitored at least one electrical quantity and at least one reference pattern representative of a class of sample devices or appliances.

15. The method of claim 14, wherein inserting the at least one sample device or appliance in a candidate list comprises:

inserting the class of sample device or appliances in the candidate list in case the value related to the calculated cross-correlation is above the predetermined threshold.

16. The method of claim 15, wherein identifying the device or appliance comprises:

in case more than one class of sample devices or appliances is included in the candidate list, selecting one of the more than one class of sample devices or appliances; and identifying the device or appliance from the selected class of sample devices or appliances based on respective cross-correlations between the evolution in time of the monitored at least one electrical quantity and reference patterns representative of members of the selected class of sample devices or appliances.

17. The method of claim 13, wherein the monitored at least one electrical quantity comprises instantaneous power consumption over time of the device or appliance.

* * * * *